US007309620B2

(12) United States Patent
Fonash et al.

(10) Patent No.: US 7,309,620 B2
(45) Date of Patent: Dec. 18, 2007

(54) USE OF SACRIFICIAL LAYERS IN THE MANUFACTURE OF HIGH PERFORMANCE SYSTEMS ON TAILORED SUBSTRATES

(75) Inventors: Stephen J. Fonash, State College, PA (US); Handong Li, University Park, PA (US); Youngchul Lee, State College, PA (US); Joseph D. Cuiffi, State College, PA (US); Daniel J. Hayes, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 10/340,723

(22) Filed: Jan. 13, 2003

(65) Prior Publication Data
US 2003/0157783 A1 Aug. 21, 2003

Related U.S. Application Data

(60) Provisional application No. 60/408,235, filed on Sep. 4, 2002, provisional application No. 60/347,850, filed on Jan. 11, 2002, provisional application No. 60/348,258, filed on Jan. 11, 2002, provisional application No. 60/348,259, filed on Jan. 11, 2002.

(51) Int. Cl.
*H01L 21/00* (2006.01)
(52) U.S. Cl. .................. 438/53; 438/960; 438/977; 257/E33.018; 257/E21.151
(58) Field of Classification Search .............. 438/52, 438/53, 458, 459, 977, 960, FOR. 438, FOR. 485; 257/E33.018, E21.151
See application file for complete search history.

(56) References Cited

U.S. PATENT DOCUMENTS 4,849,071 A 7/1989 Evans et al.

(Continued)

FOREIGN PATENT DOCUMENTS

DE 198 41 430 5/2000

(Continued)

OTHER PUBLICATIONS

"A novel fabrication technology for Si TFTs on flexible substrates", Y. Lee, S. Bae and S. Fonash, ECS Extended Abstracts, Electrochemical Society meeting, Oct. 2000, p. 791.

(Continued)

*Primary Examiner*—Michelle Estrada
(74) *Attorney, Agent, or Firm*—Nixon Peabody, LLP

(57) ABSTRACT

The invention relates to methods for preparing a removable system on a mother substrate. The method deposits a high surface to volume sacrificial layer on a mother substrate and stabilizes the sacrificial layer by a) removing volatile chemical species in and on the sacrificial layer and/or b) modifying the surface of the layer. The method coats over the sacrificial layer with a capping medium. A system is the fabricated on the capping medium. The method provides through holes to access the sacrificial layer. The method may also apply a top layer onto the system to form a covered system. The invention also includes the step of removing the sacrificial layer to release the system from the mother substrate. Methods of the invention also include selectively removing a portion of the system and capping layers to form void regions defining an array of islands composed of device, structure, or system and capping layer regions, and optionally filling the island-defining void region with a sacrificial material. In such methods the sacrificial material and the high surface to volume sacrificial layer are removed to release the system from the mother substrate. Methods of the invention also include applying a layer to the capping material side of the released system to form a configuration wherein the system is substantially within a bending-stress reduced neutral plane. The systems fabricated according to the invention may be placed on a wide variety of suitable substrates, including flexible substrates.

25 Claims, 11 Drawing Sheets

U.S. PATENT DOCUMENTS

| | | | |
|---|---|---|---|
| 4,995,954 A | | 2/1991 | Guilinger et al. |
| 5,242,863 A | * | 9/1993 | Xiang-Zheng et al. ......... 438/53 |
| 5,262,000 A | * | 11/1993 | Welbourn et al. .............. 216/2 |
| 5,352,635 A | | 10/1994 | Tu et al. |
| 5,573,679 A | | 11/1996 | Michell et al. |
| 5,594,171 A | | 1/1997 | Ishida et al. |
| 5,641,709 A | | 6/1997 | Lee |
| 5,690,753 A | | 11/1997 | Kawauchi et al. |
| 5,690,763 A | | 11/1997 | Ashmead et al. |
| 5,811,348 A | | 9/1998 | Matsushita et al. ......... 438/455 |
| 5,834,333 A | | 11/1998 | Seefeldt et al. |
| 5,854,123 A | | 12/1998 | Sato et al. .................. 438/507 |
| 5,855,801 A | | 1/1999 | Lin et al. |
| 5,866,204 A | | 2/1999 | Robbie et al. |
| 5,880,026 A | | 3/1999 | Xing et al. |
| 5,907,765 A | | 5/1999 | Lescouzeres et al. |
| 5,925,581 A | | 7/1999 | Tolbert |
| 6,048,734 A | | 4/2000 | Burns et al. |
| 6,057,149 A | | 5/2000 | Burns et al. |
| 6,106,913 A | | 8/2000 | Scardino et al. |
| 6,110,590 A | | 8/2000 | Zarkoob et al. |
| 6,158,824 A | | 12/2000 | Yonemura et al. ....... 303/113.5 |
| 6,214,701 B1 | | 4/2001 | Matsushita et al. ......... 438/458 |
| 6,225,192 B1 | | 5/2001 | Aspar et al. ................. 438/450 |
| 6,231,744 B1 | | 5/2001 | Ying et al. |
| 6,248,422 B1 | | 6/2001 | Robbie et al. |
| 6,288,390 B1 | | 9/2001 | Siuzdak et al. |
| 6,372,608 B1 | | 4/2002 | Shimoda et al. ............ 438/455 |
| 6,399,177 B1 | | 6/2002 | Fonash et al. ............... 428/119 |
| 6,449,079 B1 | * | 9/2002 | Herrmann ................... 359/214 |
| 6,486,041 B2 | | 11/2002 | Henley et al. .............. 438/458 |
| 6,555,443 B1 | * | 4/2003 | Artmann et al. ............ 438/458 |
| 6,774,010 B2 | * | 8/2004 | Chu et al. ................... 438/458 |
| 6,905,655 B2 | | 6/2005 | Gabriel et al. |
| 2001/0035700 A1 | | 11/2001 | Percin et al. |
| 2002/0020053 A1 | | 2/2002 | Fonash et al. |
| 2002/0068419 A1 | * | 6/2002 | Sakaguchi et al. .......... 438/458 |
| 2002/0197836 A1 | * | 12/2002 | Iyer et al. ................... 438/585 |
| 2004/0005258 A1 | | 1/2004 | Fonash et al. |

FOREIGN PATENT DOCUMENTS

| | | | |
|---|---|---|---|
| EP | 0 297 258 | | 4/1992 |
| EP | 0895276 A1 | * | 2/1999 |
| EP | 0 993 029 | | 4/2000 |
| GB | 2 258 236 A | | 2/1993 |
| WO | WO 97/40385 | | 10/1997 |
| WO | WO 9927325 A2 | * | 6/1999 |
| WO | WO 00/74932 A1 | | 12/2000 |
| WO | WO 01/75415 A2 | | 10/2001 |
| WO | WO 01/80286 A2 | | 10/2001 |
| WO | WO 03/050854 A2 | | 6/2003 |

OTHER PUBLICATIONS

"Flexible display enabling technology", S. Wagner, S. Fonash, T. Jackson and J. Sturm, Cockpit Displays VIII: Displays for Defense Applications, Proc. SPIE vol. 4362, p. 226-244, Sep. 2001.

"Enabling technologies for plastic display", J. Sturm, H. Gleskova, T. Jackson, S. Fonash, and S. Wagner, Cockpit Displays IX: Displays for Defense Applications, Proc. SPIE vol. 4712, p. 222-236, Aug. 2002.

"Transfer approach toward fabricating poly-Si TFTs on plastic substrates" H. Li, Y. Lee and S. Fonash, ECS Extended Abstracts, Electrochemical Society meeting, Oct. 2002, p. 647.

"High Performance Poly-Si TFTs on Plastic Substrates Using a Nano-Structured Separation Layer Approach", Y. Lee, H. Li and S. Fonash, IEEE Electron Device Letters, p. 1-3, Oct. 9, 2002.

Kalkan A. et al., "*Nanocrystalline Si Thin Films With Arrayed Void-Column Network Deposited by High Density Plasma*", Journal of Applied Physics, vol. 88, No. 1, Jul. 1, 2000, pp. 555-561.

Lee, Y. et al., "*High-Performance Poly-Si TFTs on Plastic Substrates Using a Nano-Structured Separation Layer Approach*", IEEE Electron Device Letters, vol. 24, No. 1, Jan. 1, 2003, pp. 19-21.

Tayanaka, H. et al., "*Thin-Film Crystalline Silicon Solar Cells Obtained by Separation of a Porous Silicon Sacrificial Layer*", Crystalline Silicon Solar Cells and Technologies, vol. 2, Jul. 6, 1998, pp. 1272-1277.

Anderson, et al., Porous Polycrystalline Silicon: A new material for MEMS, J. Micromech. Systems, vol. 3, No. 1, Mar. 1994, 10-18.

Bell, et al., Porous silicon as a sacrificial material, J. Micromech. Microeng., 6 (1996) 361-369.

Marsen, et al., Fullerene-Structured Nanowires of Silicon, Physical Review B, vol. 60, No. 16, Oct. 15, 1999, 593-600, The American Physical Society.

Boer, et al., Micromachining of buried micro channels in silicon, J. Micromech. Systems, vol. 9, No. 1, Mar. 2000, 94-103.

Peng, et al., Formation of Nanostructured Polymer Filaments in Nanochannels, JACS Communications, American Chemical Society, received Feb. 6, 2003.

Edited by—H. Baltes, W. Göpel, J. Hesse, Sensors Update, vol. 4, Wiley-Vch Verlag GmbH, D-69469 Weinheim, Federal Republic of Germany, 1998, 1-220.

E.I. Givargizov, Fundamental Aspects of VLS Growth, Journal of Crystal Growth, 31, 1975, 20-30, North-Holland Publishing Company.

Bjerneld, et al., Laser-Induced Growth and Deposition of Noble-Metal Nanoparticles for Surface-Enhanced Raman Scattering, Nano Letters, 2003 vol. 3., No. 5, 593-596, American Chemical Society.

French, Development of surface micromachining techniques compatible with on-chip electronics, J. Micromech. Microeng. (1996) 197-211.

Furukawa, et al., Nickel Surface Micromachining, Sixth International Symposium on Micro Machine and Human Science, 1995, pp. 161-165, IEEE.

H. G. Craighead, Issues In Nanotechnology Review—Nanoelectromechanical Systems, Science Mag. Nov. 24, 2000, vol. 290, 532-1535.

International Search Report, Nov. 2, 2001, PCT Application No. PCT/US01/12281.

Fritz, et al., Translating Biomolecular Recognition into Nanomechanics, Science Magazine, Apr. 14, 2000, vol. 288, 316-318.

Kim, et al., Thin-Film Micromirror Array, Information Display Apr. & May 1999, 30-33.

Wagner, et al., Vapor-Liquid-Solid Mechanism Of Single Crystal Growth, Applied Physics Letters, vol. 4, No. 5, Mar. 1, 1964, 89-90.

Michael Roukes, Nanoelectromechanical System Face The Future, Physicsweb, Feature: Feb. 2001, 1-6, http://physicsweb.org/articles/world/14/2/8/2.

Cheng, et al., Role of Electric Field on Formation of Silicon Nanowires, Journal of Applied Physics, vol. 94, No. 2, Jul. 15, 2003, 1190-1194 American Institute of Physics.

Steiner, et al., Using porous silicon as a sacrificial layer, J. Micromech. Microeng. 3 (1993) 32-36.

Stern, et al., Nanochannel fabrication for chemical sensors, J. Vac. Sci. Technol. B 15(6), Nov./Dec. 1997, 2887-2891.

Sugiyama, et al., Micromachined sensors using polysilicon sacrificial layer etching technology, IEDM Tech. Dig., (1994) 127-130.

Supplementary Partial European Search Report, EP 01 93 48777, Jun. 22, 2005.

Turner, et al., Monolithic Fabrication of Nanofluidic Articifical Gel Media for DNA Electrophoresis, SPIE vol. 3258, 114-121.

Uhlir, Jr., Electrolytic shaping of Germanium and Silicon, The Bell System Technical Journal, Mar. 1956, 333-347.

Walter Lang, Silicon Microstructuring Technology, Materials Science and Engineering, Reports: A Review Journal R17 (1996), pp. 1-55.

Watanabe, et al., Application of a thick anode film to semiconductor devices, Review of the Electrical Communication Laboratories, vol. 19, No. 7-8, Jul.-Aug. 1971, 899-903.

Yonehara, et al., ELTRAN; SOI-Epi Wafer by Epitaxial Layer Transfer from Porous Si, ELTRAN, Electrochemical Society Proceedings, vol. 2000-25, Abstract No. 438.

Chou, et al., Nanoimprint lithography, J. Vac. Sci., Tech. B, 1996 14(6).

Colburn, et al., Step and Flash Imprint Lithograph, Solid State Technology, Jul. 2001.

Resnick, et al., High Resolution Templates for Steps and Flash Imprint Lithograph, J. Microlith., Microfab., Microsyst., vol. 1 No. 3, Oct. 2002.

Bender, et al., Multiple Imprinting in UV based Nanoimprint Lithography: Related Materials Issues, Microelectronic Engineering, 61-62 (2002), pp. 407-413.

Taniguchi, et al., Measurement of Adhesive Force Between Mold and Photocurable Resin in Imprint Technology, Japanese Journal of Applied Physics, Part 1, vol. 40, 2002, 4194-4197.

Shan, et al., From Si Source Gas Directly to Positioned, Electrically Contacted Si Nanowires: The Assembling "Grow-in-Place" Approach, Nano Letters, 2085-2089, vol. 4, No. 11, 2004.

Peng, et al., Formation of Nanostructured Polymer Filaments in Nanochannels, J. Am. Chem. Soc. 2003, 125, 9298-9299.

Nam, et al., A STEP-and-GROW Technique—An Economic and Environmentally Safe Manufacturing Approach for Fabricating Ordered Nano Structures, Center for Nanotechnology Education and Utilization. The Pennsylvania State University, University Park, PA 16802 USA, Department of Industrial & Manufacturing Engineering, The Pennsylvania State University, University Park, PA 16802 USA.

* cited by examiner

First release layer
Substrate

Capping Layer
First release layer
Substrate

Devices
Capping Layer
First release layer
Substrate

Second release material

Devices
Capping Layer
First release layer
Substrate

A Specific Example of a Separation Layer (Sacrificial) Film sacrificial layer

USE OF SACRIFICIAL LAYERS IN THE MANUFACTURE OF HIGH PERFORMANCE SYSTEMS ON TAILORED SUBSTRATES

PRIORITY CLAIM

This application claims benefit under 35 U.S.C. §119 to provisional applications Ser. Nos. 60/347,850, 60/348,259, 60/348,258, all filed Jan. 11, 2002, and 60/408,235, filed Sep. 4, 2002; all of which are incorporated herein by reference.

GOVERNMENT RIGHTS

The United States Government has rights in this invention under DARPA Grant No. S33615-98-1-5164.

FIELD OF THE INVENTION

The invention relates to the use of sacrificial layers to fabricate systems on a mother substrate followed by separation of the system from the mother substrate. More particularly the invention relates to stabilizing the sacrificial layer and fabricating high performance substrates with high temperature processing.

BACKGROUND OF THE INVENTION

There is a considerable, growing demand for microelectronic, opto-electronic, photovoltaic, bio-systems, optics systems, and micro-electromechanical systems on insulator substrates and on durable, and even light weight and flexible substrates such as metal, ceramic, glass, and plastic foils. There is also a demand for such systems on extremely large substrates such as in display applications. Fabricating high performance systems on these substrates is very challenging since these substrates can have intolerable surface roughness and often display thermal and mechanical instability during the fabrication processes flow. In addition, in situations where these systems are desired on large substrates, the lithography tools are extremely expensive or non existent. Furthermore, the fabrication of high quality opto-electronic, bio-systems, photovoltaic, optics systems, and micro-electromechanical, systems directly on non-conventional substrates can suffer from the limitation imposed by maximum process temperature tolerated by the substrates themselves. With these constraints it is virtually impossible to achieve system performances equivalent to that seen, for example, on conventional substrates such as silicon wafers.

Attempting to address this problem researchers have employed mother substrates and separation layers to build devices and systems followed by separation from the mother substrate and application to a permanent substrate. A number of groups have developed separation approaches but these are limited in their applicability.

Shimoda and Inoue (T. Shimoda, S. Inoue, "Surface free technology laser annealing (SUFTLA)," *International Electron Device Meeting (IEDM) Tech. Dig.*, 2289-2292 (1999)) have used a-Si:H as a sacrificial (release) layer with a physical separation approach. This method cannot be used in process flows where temperatures above 400° C. are utilized (due to hydrogen out-diffusion from a-Si:H). This method also requires a transparent mother substrate to allow laser beam impingment.

T. J. Rinke et al. (T. J. Rinke, R. B. Bergmann, and J. H. Werner, Quasi-monocrystalline Silicon for Thin Film Devices, Appl. Phys. A 68 pp. 705-707 (1999)) have another separation scheme. That scheme uses electrochemically etched silicon as the separation layer but which can only use silicon as the mother substrate and this mother substrate is partially consumed in the electro-chemical etch step needed to create the separation layer.

There has also been considerable work done by a number of groups using silicon wafers as the mother substrate for the so-called SOI technology. These approaches have the names SIMOX, Bonding/thinning, or Smart-cut, depending on the specifics of the approach. All start with the size and material limitations of single crystal Si wafers (e.g., see MRS Bulletin, Material Research Society, Volume 23, Number 12, December 1998).

Asano and Kinoshita have also demonstrated a separation approach resulting in TFTs on a plastic substrate. However, this approach is based on using glass as the mother substrate and then etching (dissolving) the glass away to achieve release. Because of its use of low temperature glass, the process is limited in the temperature range allowed for processing and, of course, their mother substrate is not reusable.

Other separation techniques involving the mechanical separation of separation layer are described in U.S. Pat. Nos., 5,811,348; 6,486,041; 6,214,701; 6,225,192; 6,159,824; 5,854,123 and in DE 198 41 430 A1, EP 00993 029 A3, and EP 0 797 258. Separation by exfoliation of a separation layer is described in U.S. Pat. No. 6,372,608.

Even with this work on separation layers there remains a need in the art to fabricate systems and devices that can readily be used on non-conventional substrates. This invention uniquely answers that need of fabricating high performance systems for non-conventional substrates by fabricating the desired system in a building layer or layers on a "mother" substrate using a stabilized sacrificial layer, releasing the fabricated system from the mother substrate, and simultaneously controlling any stress associated with this fabrication/release procedure. The invention enables large area, high quality systems to be fabricated on high-temperature tolerant mother substrates such as fused silica, quartz, or silicon sheets and then to be transferred to non-conventional, even temperature-intolerant substrates. The transferred system can be further encapsulated to improve robustness, mechanical stress resistance, and environmental stability. In the case where the final positioning is on a flexible substrate, the systems of the final structure can be located at or near the neutral bending plane thereby minimizing the mechanical stress during any bending or flexing of the final substrate. In the case of very large final substrates all lithography issues can be circumvented by the use of tiling. In another variant of the invention, the final substrate may be placed on the system before separation thereby eliminating any defined transfer step to the final substrate.

BRIEF DESCRIPTION OF THE FIGURES

FIG. 10(*c*) depicts finishing the sacrificial layer deposition and shows the groove pattern is turned into sealed microchannel structure.

FIG. 10(*d*) depicts deposition of a capping material to protect the sacrificial layer and also to protect the system devices from the chemical reaction that will take place on the underlying release layer during the release process.

FIG. 10(*e*) depicts conventional fabrication of system devices on the capping layer of the channel structure formed on the mother substrate.

FIG. 10(*f*) depicts deposition or coating of a polymer (plastic) film using spin coating, CVD coating, spray coating, or any other appropriate technique.

FIG. 10(*g*) shows the release (separation) of the system, including the plastic film, by sacrificially dissolving the release layer by appropriate chemical or reactive gases supplied through the micro-channels.

FIG. 11(*b*) is an actual example of a deposited separation layer which is comprised of silicon dioxide nano-particles covalently bound to the substrate.

SUMMARY OF THE INVENTION

Figure 1:
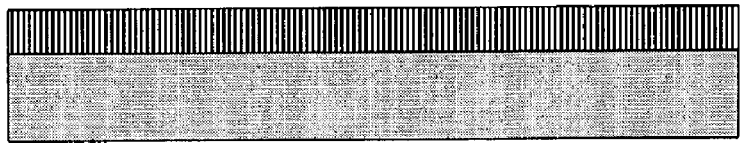
FIG. 1 depicts depositing a high surface to volume sacrificial layer on a rigid and smooth surfaced "mother" substrate by an appropriate coating technique.

The invention relates to method for preparing a removable system on a mother substrate. The method deposits a high surface to volume sacrificial layer on a mother substrate, stabilizes the sacrificial layer by a) removing volatile chemical species in and on the sacrificial layer and/or b) modifying the surface of the layer, coats over the sacrificial layer with a capping medium, fabricates a system on the capping medium, and provides through holes to access the sacrificial layer. Preferably, the high surface to volume material is a columnar void film, beads or nanoparticles. After fabricating the system. the methods of the invention may also apply a top layer onto the system to form a covered system. In a method of the invention the exposed surface of the system may also be conditioned to enhance bonding of a top layer to the system surface. Methods of the invention may also include the step of removing the sacrificial layer to release the system from the mother substrate.

In another embodiment, methods of the invention also include, during or after the fabricating step but prior to application of the top layer, and prior to providing any top through holes, the steps of selectively removing a portion of the system and capping layers to form void regions defining an array of islands composed of device, structure, or system and capping layer regions, and optionally filling the island-defining void region with a sacrificial material. In such methods the sacrificial material and the high surface to volume sacrificial layer are removed to release the system from the mother substrate.

The invention also relates to a method for preparing a sacrificial release layer on mother substrate. In this method a high surface to volume sacrificial layer is deposited on a mother substrate and the sacrificial layer is stabilized by a) removing volatile chemical species in and on the sacrificial layer and/or b) modifying the surface of the layer. The method may also include coating over the sacrificial layer with a capping medium.

In another embodiment, methods of the invention include the step of applying a layer to the capping material side of the released system to form a configuration wherein the system is substantially within a bending-stress reduced neutral plane.

The invention also relates to systems prepared by the methods of the invention.

DETAILED DESCRIPTION

The invention relates to the manufacture of high performance systems containing a single device or element or a combination of devices or elements such as transistors, diodes, electron devices, chemical devices, biological devices, bio-chemical devices, fluidic devices, MEMs, sensors, fuel cells, opto-electronic devices, photovoltaic cells, optical structures microelectronic devices, displays, or circuit board systems the like. The chemical devices, biological devices, bio-chemical devices include but are not limited to, reactors. Using the methods of the invention such systems may be applied to non-conventional substrates such as flexible, non-planar, or very large area substrates. The method of the invention is based on fabricating or building the system on a mother substrate and then releasing a layer or layers containing the desired system. The system may be transferred to the final substrate after separation or the final substrate may be placed by some process such as adherence, deposition, or spin-on onto the system before separation. The method of the invention may be used to manufacture a single system or multiple systems. The invention utilizes sacrificial films to separate the system from a rigid, "mother" substrate, which, preferably, may be reused. The use of separation layers and techniques and fabrication of devices and systems is disclosed in U.S. Published Patent Application US 2002/0020053 A1, which is incorporated herein in its entirety. This invention employs a high surface to volume sacrificial layer and improves upon known methods by stabilizing and/or protecting the sacrificial layer. The invention also discloses a means to further enhance system mechanical and environmental robustness by subsequent encapsulation.

The methods of the invention have the advantages of (1) completely isolating the final substrate from the thermal and, in general, full processing history involved in the system fabrication, (2) allowing the use of any final substrate including plastic, metal, and glass foils, (3) reducing mechanical stress problems by providing stress release areas around system components while simultaneously or sequentially releasing the system from its "mother" substrate, (4) allowing tiling if needed for large final substrates, (5) allowing the system to be transferred to a final substrate after separation or allowing the final substrate to be applied prior to separation, (6) allowing further encapsulation during or after transfer enhancing mechanical and environmental robustness, (7) allowing heat sinking or active flow heat removal to be built into the system/final substrate, and/or (8) allowing the system to be positioned at or near the stress neutral plane of the final substrate reducing effects of any substrate flexing.

The invention relates to methods for preparing a removable system on a mother substrate. In general the methods of the invention involve the steps of:

depositing a high surface to volume sacrificial layer on a mother substrate, stabilizing the sacrificial layer by 1) removing volatile chemical species in and on the sacrificial layer and/or 2) modifying the surface of the layer, coating the surface of the sacrificial layer with a capping medium fabricating a system on the capping medium, and providing through holes to access the sacrificial layer.

The methods of the invention also include the step of removing the sacrificial layer to release the system from the mother substrate. Other aspects of methods of the invention are discussed below. As also discussed below, the system may then be applied to any type of substrate.

In another embodiment the invention relates to methods for preparing a sacrificial release layer on mother substrate. The methods deposit a high surface to volume sacrificial layer on a mother substrate, and stabilize the sacrificial layer by a) removing volatile chemical species in and on the sacrificial layer and/or b) modifying the surface of the layer. As with the other embodiments, the methods may also coat over the sacrificial layer with a capping medium.

The "mother" substrate provides mechanical and temperature stability to the devices during the fabrication processes. This substrate should have mechanical stability for handling, temperature stability at high temperatures, and coefficients of expansion compatible with the device material choices. Any conventional rigid smooth substrate may be chosen as the mother substrate due to its having a smooth surface and compatibility with microelectronics processing. Material choices for the mother substrate include but are not limited to semiconductors (e.g., silicon wafer or sheets), glasses including specialty glass (Corning 1737, etc.), fused silica, quartz, ceramics (e.g., alumina), and metals (e.g., steel). This mother substrate is intended to be reusable and may or may not have a coating or covering layer on its surface. The mother substrate may be recoated with each use.

The methods of the invention use of a stabilized high surface to volume sacrificial layer that permits high temperature processing, when such processing is required, for the fabricating of a system such as those discussed. Fabrication of a system or a particular device within a system may be accomplished using techniques know in the art. The sacrificial layer exists between the mother substrate and the system. The structure built upon the mother substrate houses the functioning system. The latter is comprised of (e.g., deposited and etched) combinations of materials constructed to form systems, elements, devices, and interconnects, as required. When the full flexibility of high temperature processing for system manufacture is desired, the sacrificial layer should possess one or more of the features listed in Table 1:

TABLE 1

SACRIFICIAL LAYER CRITERIA

Withstand high processing temperatures (T < 1200° C.).
Not diffuse to a significant degree during high-temperature processing.
Not adversely chemically react to any significant degree
during high-temperature processing.
Withstand processing chemicals or be compatible with being
protected from processing chemicals.
Not produce excessive gaseous products during removal.
Not introduce significant stress problems during processing
Be removable by chemical/physical attack which does not affect
the system structure. This may be accomplished by either selectivity,
attacking-chemical access-pathway positioning, barrier layer design,
or some combination.
Support lateral transport of the attacking chemicals to create a
relatively uniform separation
Have a high surface to volume ratio morphology to enhance transport and
removal
If it has a high surface to volume ratio morphology, this feature must be
sustained during processing
Capable of being deposited allowing ease of mother substrate reuse.

The sacrificial layer is formed using a high surface area to volume material. In a preferred embodiment, the sacrificial layer is a columnar void film. Typically the columnar void film is a semiconductor material. Preferably, the columnar void film may be a film composed of silicon, silicon oxide, germanium, germanium oxide, a silicon alloy such as SiGe, SiGeC and the like. The film may also contain hydrogen, chlorine, or fluorine. U.S. Pat. No. 6,399,177 B1 describes the deposition of such films and is incorporated herein by reference. A columnar void silicon film, which, unlike conventional porous silicon, is deposited, involves no electrochemical etching, and has a unique, regular and controllable columnar void morphology wherein the silicon penetrates the void. Columnar void network silicon sacrificial layers are described in published U.S. Patent Application No. US 2002/0020053 A1. Using plasma deposition processes at low temperatures allows the material to be laid down on a wide variety of substrates. As a sacrificial layer columnar void network silicon gives a fast etch rate even when etched through small sized, wet-etchant access windows. The open region of the columnar void network silicon film allows fast transport of the etchant and reaction products in sacrificial layer removal and the fast sacrificial etch rate increases overall process reliability. In addition, the fast etch rate allows the making of fine structures with thin capping layers. Other examples of the use of sacrificial layers having column/void silicon networks are described in "A novel fabrication technology for Si TFTs on flexible substrates", Y. Lee, S. Bae and S. Fonash, ECS Extended Abstracts, Electrochemical Society meeting, October 2000, pg 791; "Flexible display enabling technology", S. Wagner, S. Fonash, T. Jackson and J. Sturm, Cockpit Displays VIII: Displays for Defense Applications, Proc. SPIE Vol. 4362, p226-244, September, 2001; "Enabling technologies for plastic display ", J. Sturm, H. Gleskova, T. Jackson, S.

Fonash, and S. Wagner, Cockpit Displays IX: Displays for Defense Applications, Proc. SPIE Vol.4712, p222-236, August, 2002; and "Transfer approach toward fabricating poly-Si TFTs on plastic substrates" H. Li, Y. Lee and S. Fonash, ECS Extended Abstracts, Electrochemical Society meeting, October 2002, pg 647; all of which is incorporated herein by reference.

Figure 11A:
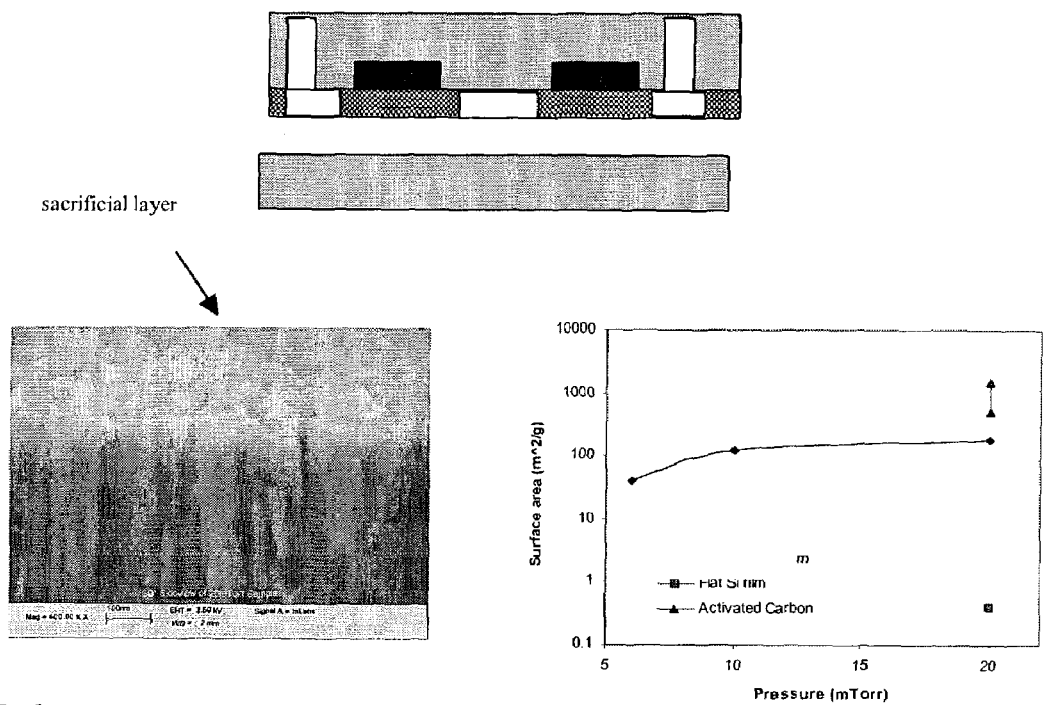
FIG. 11(*a*) is an actual example of a deposited separation layer material which meets all the criteria of Table 1. This layer is a deposited void-column silicon material. This material was used as the separation layer yielding the separated system of FIG. 8*b*.
Figure 11B:
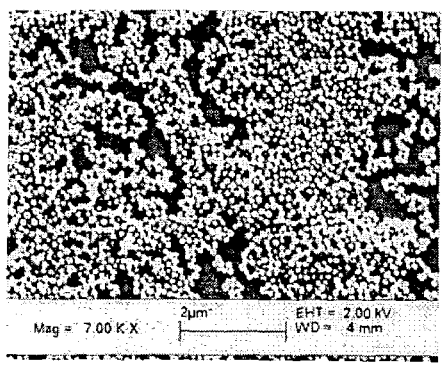

FIG. 11a shows a specific example of a separation layer material which meets all the criteria of Table 1. This layer is a deposited columnar void silicon material. As shown, it has a large surface area per gram and hence extensive void regions allowing enhancement of lateral transport and rapid chemical reaction. FIG. 11b shows another specific example of the high surface to volume sacrificial layer. In this case the use of nano-particles (e.g., Si or $SiO_2$ beads), which met the criteria of Table 1 and function as the sacrificial layer, is shown schematically. Beads or nanoparticles must be of closely uniform size, to prevent deformation of the capping layer. Alternatively, beads of various sizes may be used in the same sacrificial layer to create a more tightly packed layer or a less rough surface. The nanospheres, beads, or molecules that may be used can be comprised of a number of materials including silica beads, silicon beads, semiconductor beads, insulators beads, polymer beads, metal beads, self assembling molecules or any other sphere, polygon, or irregularly shaped nano or microscale structure. The materials should have a high surface to volume ration when formed in a monolayer or stacked structure. The beads, mother substrate or both may be functionalized with different surface chemistries or linking groups so that the beads are bound and/or patterned on the surface by covalent bonds, electrostatic attraction, hydrogen bonding, VanderWalls interactions, molecular recognition (eg. biotin-avidin interactions).

In order to use a high surface area to volume sacrificial layer in a method of the invention, particularly while fabricating systems or devices at high temperature, the sacrificial layer is stabilized. Micro and nano-structured films with high surface areas have high surface free energies causing the surface atoms to become mobile at temperatures well below their bulk meting point. This leads to densification through sintering of the film at lower temperatures, often below the fabrication temperature. This densification is not desirable when removing the film through chemically attack. Furthermore, many deposited films have species that will evolve from the film at high temperatures, like hydrogen in silicon. To stabilize the sacrificial layer so that gasses, liquids or solids do not evolve during device processing, these species may be removed prior to capping the sacrificial layer in order to prevent effects such as contamination and bubbling. An important aspect of this invention, then, is stabilizing the sacrificial layer prior to, during, or after the capping layer deposition.

The sacrificial layer may be stabilized by chemical treatment of its surface such as oxidation or nitridation in a gaseous environment or in an acidic or basic bath. The surface may also be stabilized in an annealing step or combination of annealing and chemical reaction. To remove impurities that may evolve from the sacrificial layer during high temperature processing, a chemical treatment can be done to react and/or remove surface impurities or to leach them from the material. An annealing step can also be done to remove the impurities, and again this can be in conjunction with a chemical treatment.

Figure 14:
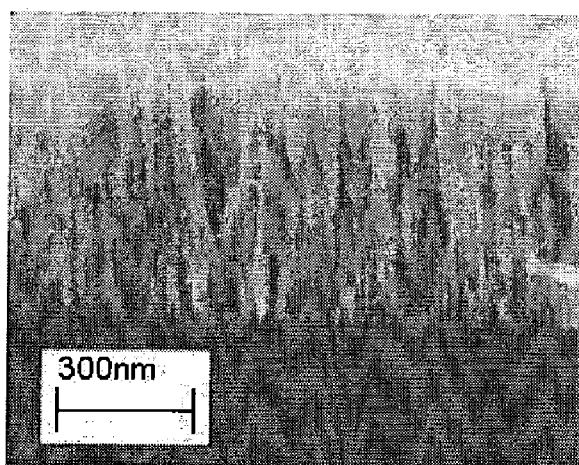
FIG. 14 shows columnar void network silicon as-deposited.
Figure 15:
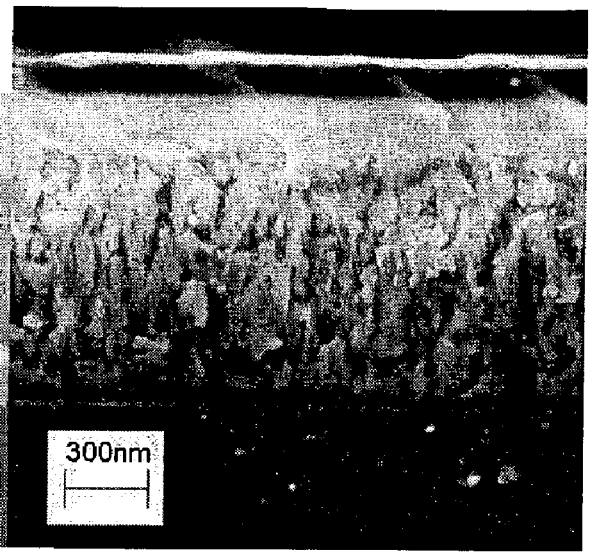
FIG. 15 shows the film after capping and high temperature processing, showing that the film retained some of its morphology and porosity.

A specific embodiment of stabilizing the sacrificial layer is the treatment of deposited column-void network silicon for use as a sacrificial layer that can withstand high temperature processing. Without a stabilization step, the film densifies significantly during subsequent processing, eliminating the continuous void network that allows for efficient removal through chemical attack. The film also significantly evolves hydrogen at temperatures above 600° C., causing bubbling and cracking of the capping layer and system or devices. One method to stabilize this sacrificial layer is an annealing process in a nitrogen environment. After deposition on the mother substrate the column void network silicon sacrificial is annealed at 550° C. for 6 hrs in a furnace purged with nitrogen. The residual oxygen in the furnace and water on the surface of the film oxidize it slightly, stabilizing the surface. The time and temperature can be variable given the conditions of the furnace and the film. Annealing in this manner also releases surface and bulk hydrogen from the sacrificial layer, incorporated during deposition. After being stabilized by such methods, the sacrificial layer is nearly structurally identical to the original as-deposited film, but modified so that its changes at high temperature are minimal, maintaining enough of the desirable morphology and composition for efficient release. FIG. 14 shows the columnar void network silicon as-deposited. After the annealing stabilization step it is nearly structurally identical. FIG. 15 shows the film after capping and high temperature processing, showing that the film substantially retained its morphology and porosity. If the film were not stabilized it would appear highly dense with few porous inclusions.

Another method to stabilize a columnar void network silicon sacrificial layer is a hydrogen peroxide treatment. When treated in a hydrogen peroxide bath, the surface and near surface hydrogen is reacted to form water and the surface is slightly oxidized. This leads to similar stabilization properties as with the anneal process. Treatment times and temperatures again depend on the nature of the column void network material. Removing volatiles from the high surface to volume sacrificial layer may also be achieved under reduced pressure or vacuum.

The methods of the invention include the step of coating over the sacrificial layer with a capping medium. The capping medium provides the surface upon with the system or devices within the system are built, and may act to further stabilize the sacrificial layer. The capping medium also provides additional protection for the sacrificial layer shielding it from chemicals etc. used in subsequent fabrication of desired system. Thus, the capping medium should not degrade significantly during subsequent processing, particularly during system fabrication. The capping medium goes over the sacrificial layer with minimal void filling creating a mechanically robust and functional chemical barrier. Capping layer materials may include ceramics, metals, oxides, nitrides, semiconductors, insulators and combinations thereof. Preferred capping mediums are $SiO_2$ and $Si_3N_4$, which may be used together in stacked film structure.

Stress problems are very common in the production of thin film systems or devices on flexible substrates and can cause "roll-up" after system release. The methods of the invention solve this problem. Stress release may be accomplished in a process variation which uses a second sacrificial material to provide access to the sacrificial layer (which may or may not be the same substance) to create stress release areas among system components. In this embodiment, a method of the invention includes during or after the fabricating step but prior to application of the top layer and prior to the release, the steps of selectively removing a portion of the system and capping layers to form void regions defining array of islands composed of device, elements, structure, or system and capping layer regions, and optionally filling the island-defining void region with a sacrificial material. The sacrificial material may be any sacrificial material and does not necessarily have to be the same as that of the sacrificial layer, although it also is preferably a high surface to volume material such as discussed above. In the methods of the invention, the fabricated system is released from the mother substrate by removing the sacrificial material and the high surface to volume sacrificial layer to release the system from the mother substrate. This may be done in a single step removing both the sacrificial material and the sacrificial layer or separate steps removing each individually. Preferably, the sacrificial material is removed to provide access to the sacrificial layer. After removal the island structure of the capping material remains. The void regions may provide stress relief to the final system and may also act as heat sinks in operation.

The methods of the invention enables high temperature processing, and therefore, high quality system component fabrication or bonding, prior to the release and final substrate steps. High quality components can be bonded into the system or their fabrication, in the system, are achievable with the present invention because there are not any inherent processing temperature limitations nor inherent stress issues. The first sacrificial material employed in the process flow example described below can be any material that is capable of tolerating high temperatures and is compatible chemically with the process flow. Exemplary materials are Si and $SiO_2$. If used, as it is in the example of FIGS. 1-8, the second sacrificial material can be any material that is easily removed, such as Si or other semiconductors, ceramics, metals, organics, polymers or combinations thereof. Removal means for either material can be chemical, physical, or some combination thereof.

After fabricating the system, the methods of the invention may also include steps to applying a polymer, glass, metal, ceramic, oxide, nitride, insulator, conductor, semiconductor, organic, plastic, or combination thereof top layer over the system to form a covered system. This top layer may be the permanent top layer for the system or may be used to adhere the system to another substrate.

In order to effectively adhere a top layer to the fabricated systems prior to release, surface chemical conditioning and adhesion techniques known in the art may be used. This may be performed on the exposed surface of the system itself or to a layer covering the system. The conditioning and adhesion techniques may encompass covalent chemical binding through the use of surface chemistry modifiers such as silanes with reactive organic linking groups. Adhesives may also be used such as epoxies or resins, or non-fully cured spin on dielectrics, glasses, and polymers. A specific embodiment of this invention is the use of a spin on dielectric, BCB (benzocyclobutene) for example, that is not fully cured prior to plastic coating. The uncured BCB has solvents and reactive organic groups that help to adhere a plastic film. The system of BCB and a deposited plastic film such as paralyne has many attractive features because of the optically transparent and dielectric properties of the BCB and the optically transparent and mechanical, and chemically resistant properties of the paralyne. Accordingly, in a preferred embodiment, a polymer layer is applied over the system a polymer layer to form a covered system or systems and conditioning the exposed surface of the polymer top layer to enhance bonding. A layer of polymer, glass, metal, or ceramic may then be applied to the conditioned polymer surface or the applied to another substrate, before or after release from the mother substrate.

Figure 10:
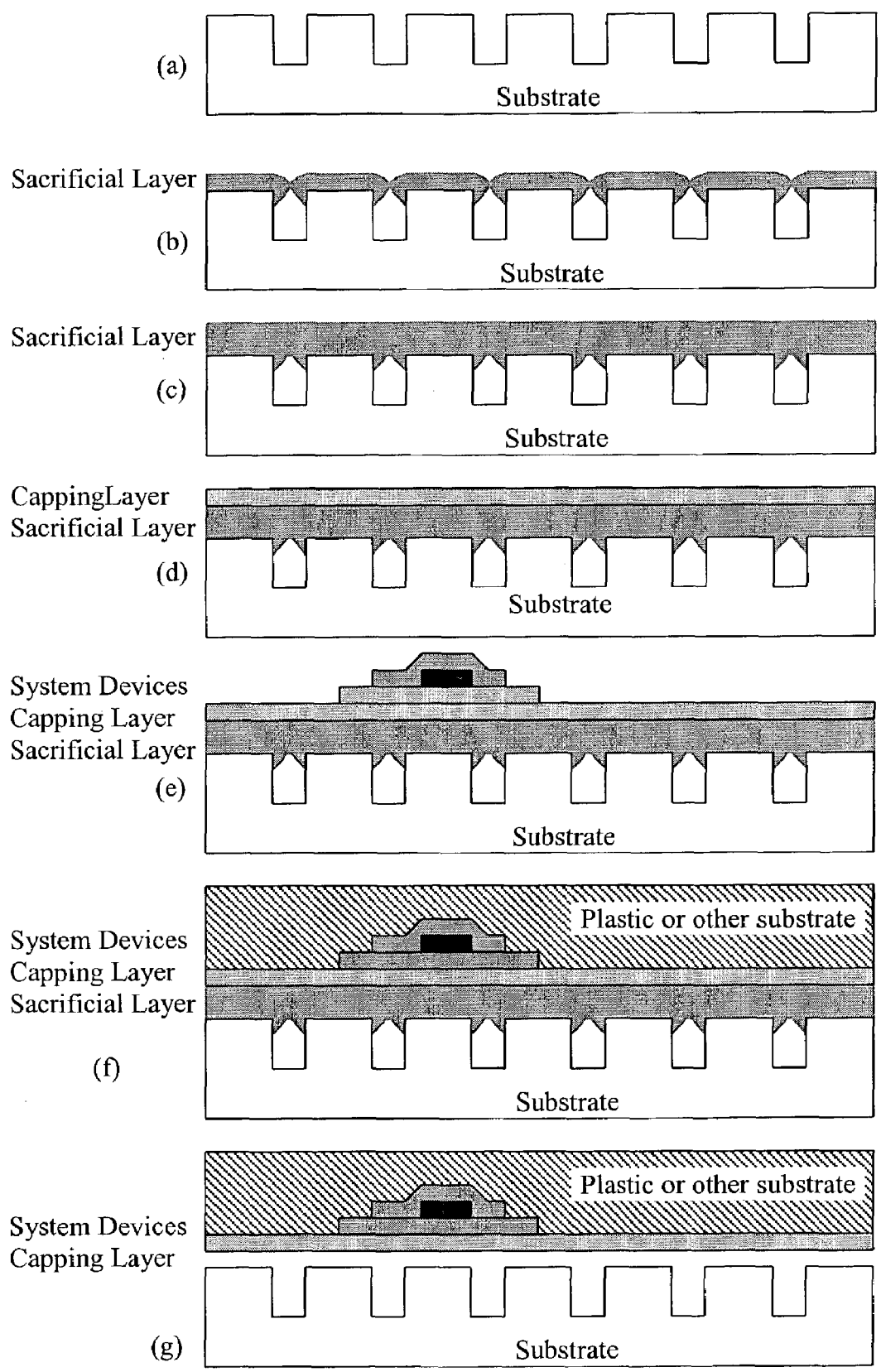
FIG. 10(*b*) depicts sacrificial layer deposition, which is preferably by a non-conformal film coating.
Figure 13A:
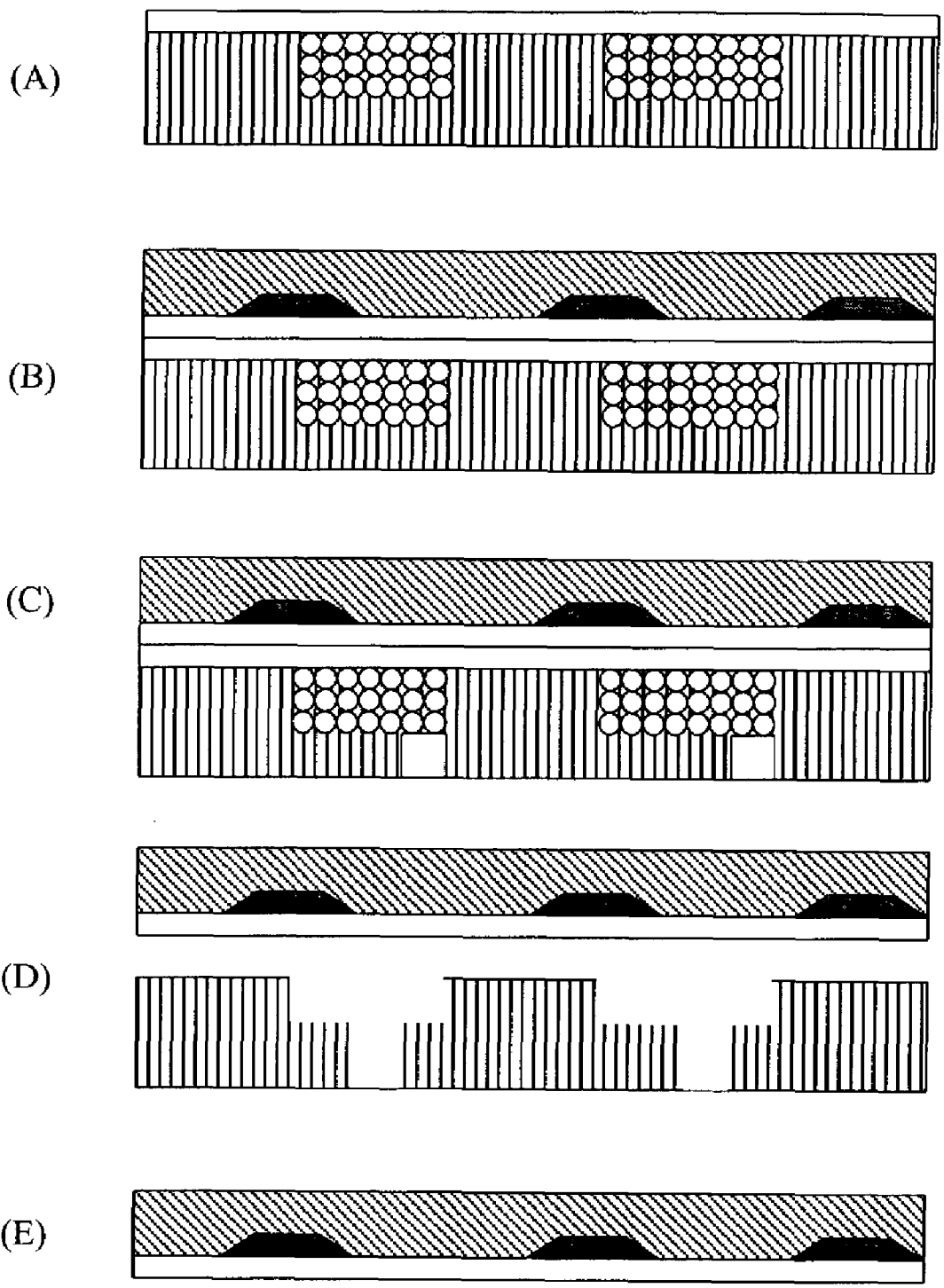
FIGS. 13*a* and 13*b* depict methods of the invention using particles as the high surface to volume sacrificial layer where the mother substrate contains channel-like through holes to access the sacrificial layer.
Figure 13B:
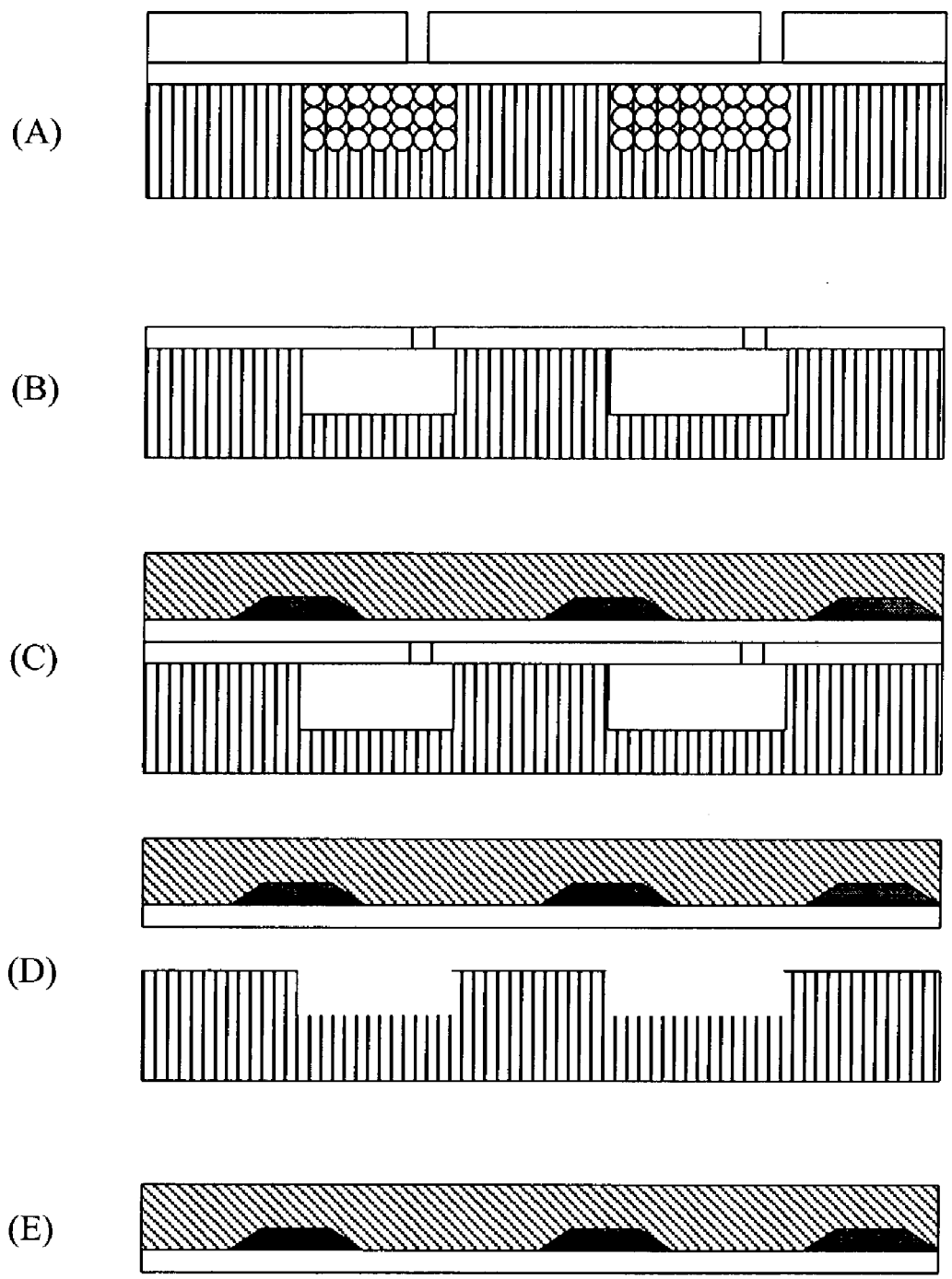

A further unique aspect of this technology is its flexibility in the release procedure. To be specific, it allows the removal of the sacrificial layers by using a vertical, a horizontal, or both micro- or nano-access network to deliver the sacrificial layer removal agent. Through holes are provided in the methods of the invention to access and remove the sacrificial layer or sacrificial material. Accordingly, the method includes the creation of through-holes down to the sacrificial layer, or at least to the sacrificial material. The location, size, and number of through-holes may be defined using lithographic techniques and the through holes created using a reactive ion etcher or other means known in the art. The through holes may be in the mother substrate in some combination of a network in the plane of the mother substrate or through the thickness of the mother substrate to access the sacrificial layer. The through holes are provided through the top layer, system or systems region, and capping layer or through both any top layer, system or systems region, capping layer and mother substrate. FIGS. 1-8 show the case where the removal agent access to the sacrificial layer is through a vertical access whereas FIG. 10 shows a process flow example where the removal agent access to the sacrificial layer is through a horizontal channel access system. FIG. 13b shows removal agent access through the mother substrate and a horizontally deployed channel network.

Figure 5A:
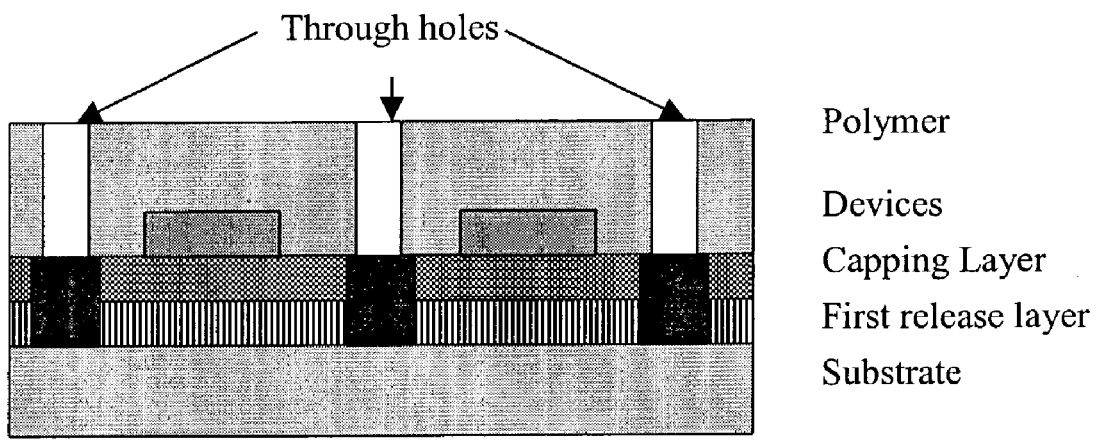
FIG. 5*a* (cross-section) and FIG. 5*b* (top-view) depict coating of a polymer layer and definition of through holes.
Figure 12:
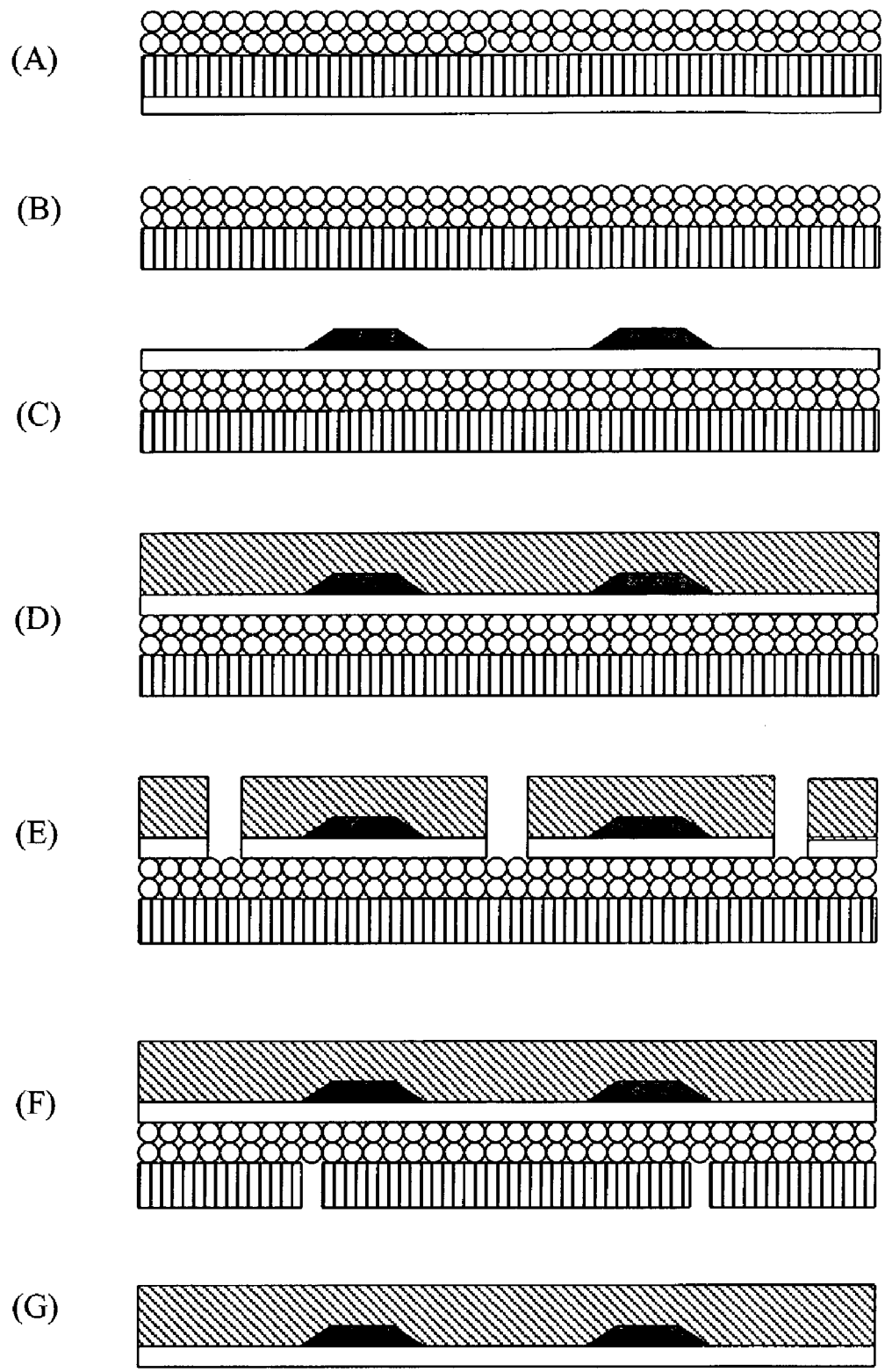
FIG. 12 depicts the method of the invention using particles as the high surface to volume sacrificial layer.

The through-holes act as conduits for the chemical (e.g., acid, base or organic solution) used to remove the sacrificial layer. This chemical flows through these conduits and penetrates down to the top of sacrificial layer, wets the sacrificial layer, and chemically attacks the sacrificial layer material. In a specific experiment to demonstrate the use of through-hole conduits, a metal sacrificial layer was evaporated and a 10-5 micron polymer layer was spin-coated on Corning 1737 glass. After the through-holes were defined with lithography and the holes were etched by reactive ion etching, the sample was dipped in an acid. The acid penetrates via the through-hole conduits to the top of the sacrificial layer, etching the sacrificial layer, and spreading laterally. The polymer coating is separated as the acid moves laterally and etches the sacrificial layer. As this separation process develops further, separated areas grow larger. As shown in FIGS. 5, 12 and 13, through-holes for chemical access to the sacrificial layer can be in the mother substrate, which, as noted, may be reusable. By removing the sacrificial layer, the device structures and circuits on the laminate can be separated from the mother substrate.

As discussed, having been released from the mother substrate, a system fabricated according to a method of the invention may be applied to another substrate. The methods of the invention are particularly useful in fabricating systems for application to flexible or non-planar substrates. Such substrates may be temporary substrates or permanent substrates. Once a system is released and transferred to the final substrate or has the final substrate applied and is released, other encapsulation steps may take place. For example, if the system components are "sandwiched" between the final substrate and another appropriately chosen material and thereby located at or near the neutral bending plane, the stresses acting on system components are reduced. The technique of this invention uniquely allows high quality, stress reduced system components to be sandwiched in this manner further enhancing their flexibility and robustness. Accordingly, the methods of the invention may include the step of applying a layer to the capping material side of the system to form a configuration wherein the system is substantially within a bending-stress reduced neutral plane.

Figure 9:
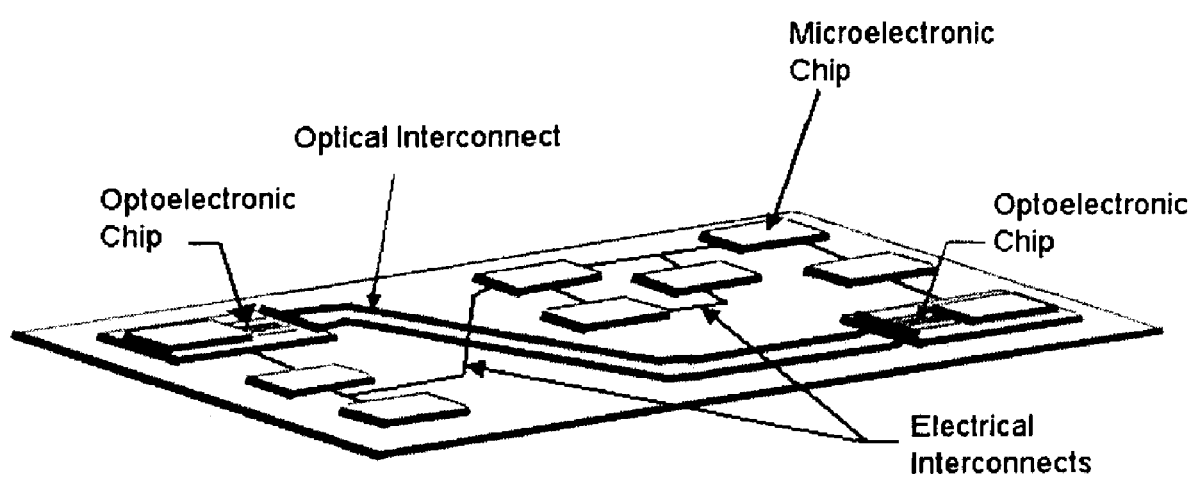
FIG. 9 depicts an application of this invention used to create a "smart circuit board" containing components such as optical, opto-electronic, and electronic elements FIG. 10(*a*) shows a groove pattern formed on a rigid and smooth substrate (mother substrate) such as a silicon sheet, quartz, fused silica, metal, sheet, or a glass panel.

As discussed above, the invention disclosed herein comprises a concept and manufacturing technology that can be applied to the fabrication of a variety of systems and devices for various systems including, but not limited to, transistors, diodes, electron devices, chemical devices, biological devices, bio-chemical devices, fluidic devices, MEMs, sensors, fuel cells, opto-electronic devices, photovoltaic cells, optical structures, microelectronic devices, displays, or circuit board systems the like. The chemical devices, biological devices, bio-chemical devices include but are not limited to, reactors. These systems may be manufactured and on small or large area substrates and even flexible substrates. The systems may be placed side-by-side, "tiled", on large area substrates to create a sinlge system or multiple systems. Furthermore, the invention may be used to make multi-layered three-dimensional structures. These may include on-board micro-fuel cell, photovoltaic cell, or chemical reactor devices. FIG. 9 shows a conceptual application of this invention used to create a "smart circuit board" containing components such as optical, opto-electronic, and electronic elements. Some of these elements may be fabricated and some may be bonded while the system is on the "mother" substrate. The system may be transferred to the final substrate (the "board" of this example) or the "board" layer may be applied to the system prior to separation.

Figure 2:
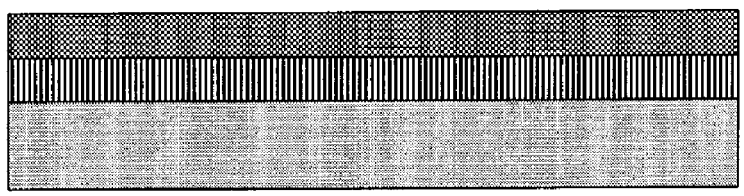
FIG. 2 depicts coating a capping material over the sacrificial layer.

EXAMPLE PROCESS FLOWS (1) Example Process Using Principally Vertical Access of Removal Agent FIGS. 1-8 illustrate an examplary process flow using a vertical access scheme for the removal process. FIG. 1 depicts a sacrificial (first release) layer deposited on a smooth, "mother" substrate such as glass, quartz, fused silica, metal sheet, silicon, or any other flat-surfaced material. After deposition on the mother substrate the sacrificial is stabilized with one of the processes mentioned above such as annealing. One or more intermediate layers may be positioned beneath this sacrificial layer, if desired. FIG. 2 illustrates the deposition of a capping layer. This is the layer upon which the system devices will be fabricated (See FIG. 3). It is the first of the "building layers". All deposition steps may be accomplished by a variety of means including spin-on approaches, physical deposition, chemical deposition, and chemical reactions. This capping layer also protects the sacrificial layer and, in the case of high surface to volume materials such as that of FIG. 11. For example, when high porosity column-void silicon (see FIG. 11) is used as the sacrificial layer, then a silicon dioxide layer, with some oxidation of the column-void Si, or just some oxidation of the column-void Si, preserves the morphology of this high surface to volume sacrificial material. Further stabilization of this type of film may include removing the surface and bulk hydrogen through an annealing or chemical process.

Figure 3:
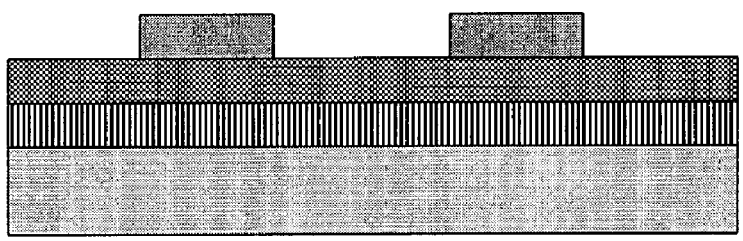
FIG. 3 depicts fabrication of a functional system on the capping layer.
Figure 4:
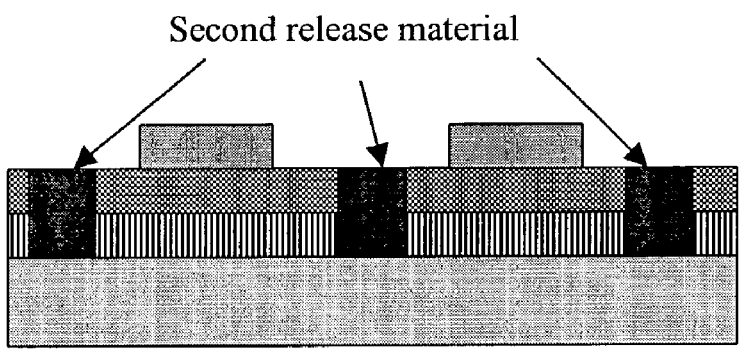
FIG. 4 depicts etching trenches around the functional system components down to the first sacrificial layer and filling the trenches with second sacrificial material by techniques know in the art, such as lift-off.

FIG. 3 shows the device structures of the system under fabrication. FIG. 4 shows an optional step: the creation of regions around the device structures (by dry etching, wet etching, or laser ablation, for example) and the filling of these by deposition of a sacrificial material as shown (second release layer). This material may or may not be the same substance as the first sacrificial layer and it may (shown in FIG. 4) or may not (not shown) replace a portion of the first sacrificial layer. Including the step of FIG. 4 offers the ability to ultimately, at least partially, mechanically, thermally, and electrically isolate the devices of the system under construction, as may be deduced from FIG. 6*b*.

Figure 5B:
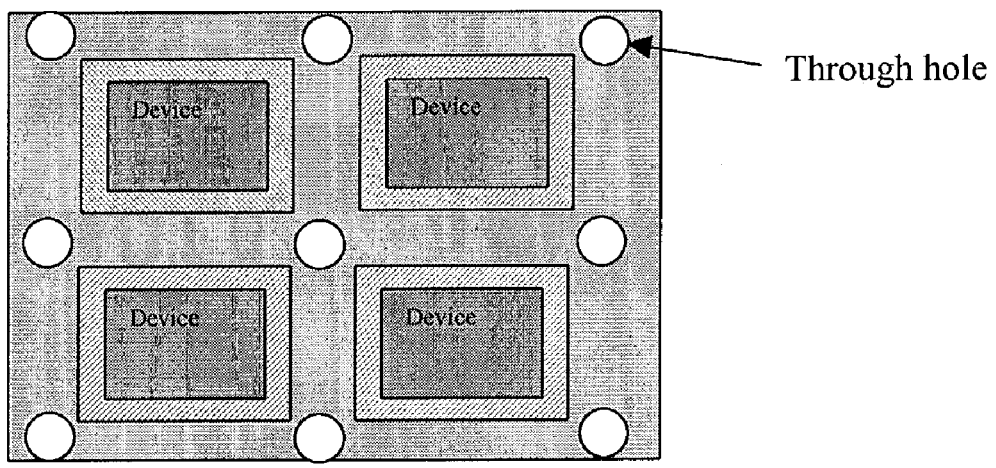

Whether or not the step shown in FIG. 4 is included, additional building layers may be positioned as seen in FIG. 5; e.g., in FIG. 5 we show a polymer layer deposited or adhered over the system device structures. These layers may be done in several layering steps and electrical interconnects or other structures of the system may be in these building layers and may be connected to other system devices through vias (not shown). One or all of these building layers is the layer that will be the final substrate or is the "carrier" layer allowing positioning of the system on its final substrate. In any case, this carrier or final layer can be a foil or plastic and flexible. Vertical through-holes are produced in these building layers as shown in FIG. 5 by some process step such as etching or ablating. As seen in FIG. 5*b*, these through holes allow access to the first and to the second sacrificial layer, when this layer is included.

Figure 6A:
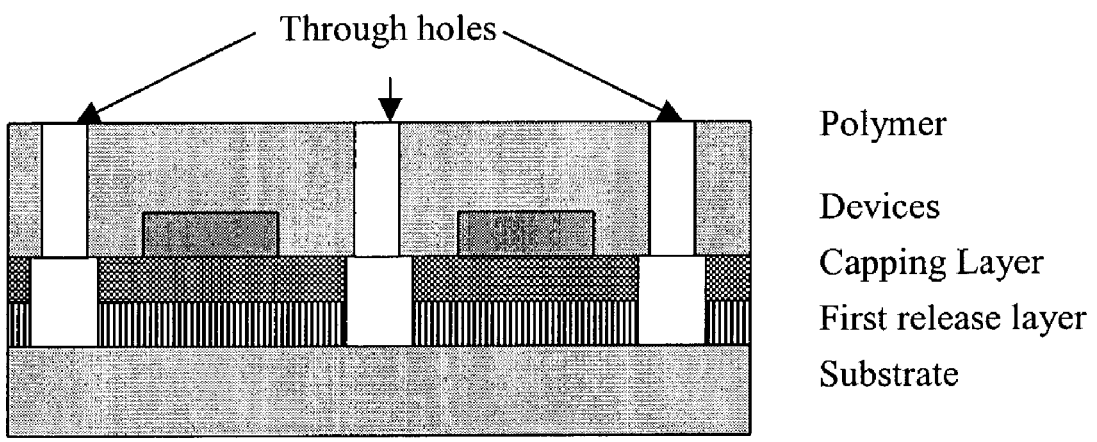
FIG. 6*a* (cross-section) and FIG. 6*b* (top-view) depict removal of the second sacrificial material.
Figure 6B:
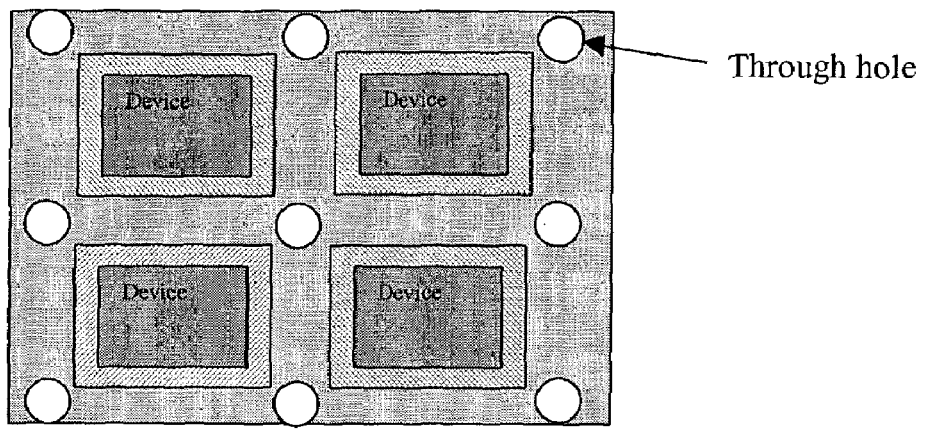
Figure 7:
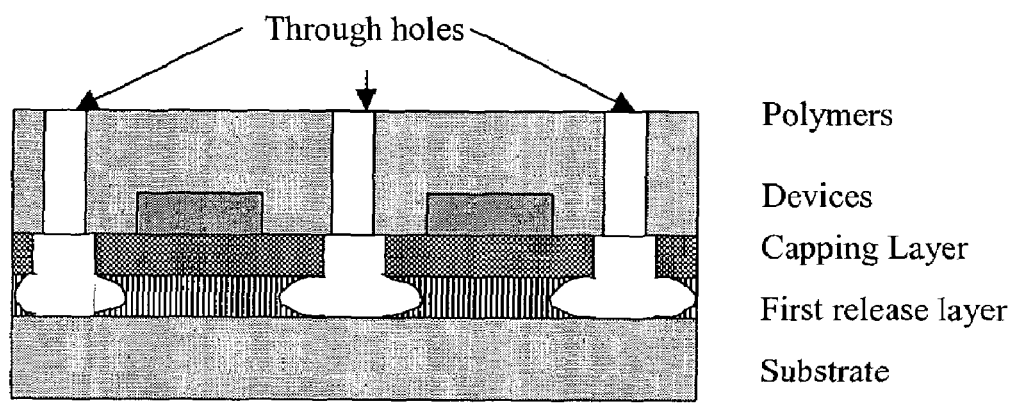
FIG. 7 depicts removal of the sacrificial layer thereby producing a system on a polymer substrate as shown in FIG. 8.
Figure 8A:
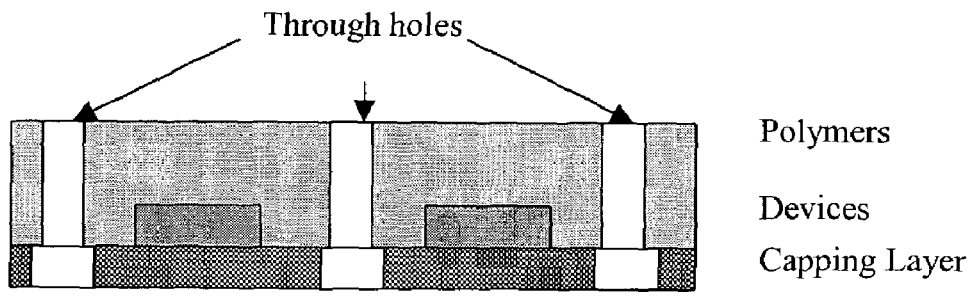
FIG. 8*a* is an example of a separated system according to the invention.
Figure 8B:
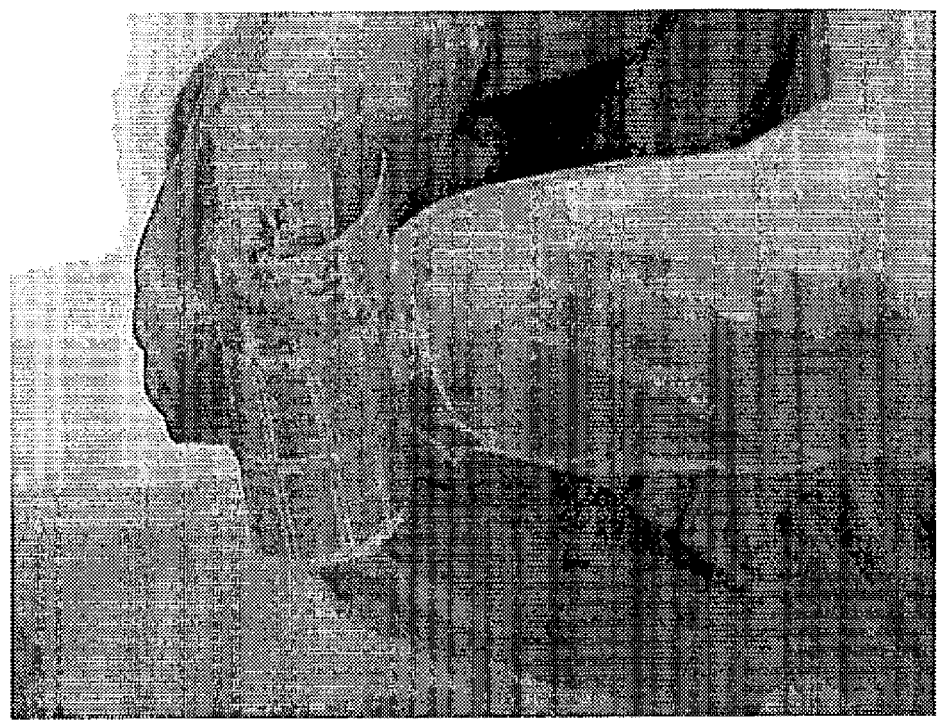
FIG. 8*b* depicts an actual separated system. In this case, TFT devices with a flexible, plastic final substrate.

Using the vertical through holes, the second sacrificial material, when present, may be removed by gasification (with gas escape by the through holes), by dissolution (with solvents entering by the through holes), or by etching (with etches entering by the through holes). This removal of the second sacrificial layer may be done first (as seen in FIGS. 6*a* and 6*b*) and then the first layer is removed (by the same or other means) or they may be removed in the same step (not shown). In either case the first sacrificial layer is the key to separation from the mother substrate and it must be removed by gasification, dissolution, or etching. This is shown underway in FIG. 7. FIG. 8 shows the final result of the processing of FIG. 7; i.e., FIG. 8 shows the system released from the mother substrate. The capping layer islands may (as shown) or may not (not shown) be kept. At this point the resulting structure of FIG. 8 may, as discussed above, be adhered to something else, it may be further processed to cover the bottom side with more material for mechanical strength and/or environmental robustness, or both may be done, and it may be used as is with at least the top part of the building layers serving as the final substrate. If more material is deposited or adhered to the bottom, it is possible to place the system devices at or near the neutral plane of the resulting overall structure.

Obvious variations of this process flow can be used including those where the vertical access holes gain access to the sacrificial layer (or layers, if the isolation approach of FIG. 4 is utilized) through the mother substrate (not shown). We note that the system of FIG. 8*b* was produced using this process flow with the step of FIG. 4. The transistors produced with this approach show excellent performance on flexible substrates.

(2) Example Process Using Principally Horizontal Access of Removal Agent

Micro- or nano-channels in a primarily horizontally arrayed layout may be used for the method of the invention. The use of micro- or nano-channels for removal agent transport and sacrificial layer access can reduce the time it takes for sacrificial layer removal (e.g., etching, dissolution, gasification). The fluid removal agents can be pumped through the channels or allowed to flow due to capillary action. A horizontal array of channels, as seen in FIG. 10, can allow for the removal agents to attack the sacrificial layer in many places, significantly reducing the time necessary for removal. Fresh reactants, reaction products, or both can be transported in the channels to further speed up the process. The reduction of exposure time to the removal agents afforded by this approach also gives the process designer more choices in material selection.

In this example, as discussed above, the "mother" substrate provides the mechanical and temperature stability to the devices during the fabrication processes. This substrate must have mechanical stability for handling, temperature stability at high temperatures, and coefficients of expansion compatible with the device material choices. Material choices for the mother substrate include but are not limited to semiconductors (e.g., silicon wafer or sheets), glasses, fused silica, quartz, ceramics (e.g., alumina), and metals (e.g., steel).

The micro- or nano-channel formation in this separation variant can take place using a variety of methods including: sacrificial layer processes, surface micro-machining, bulk micro-machining, capping techniques, and combinations thereof. The micro- or nano-channels can be a permanent feature of the mother substrate or removable during sacrificial layer etching or subsequent processes. In some cases, as detailed below, the framework for the micro- or nano-channels may be part of the mother substrate while completing step of enclosed micro- or nano-channel formation takes place during the sacrificial layer deposition.

A specific example embodiment of this invention using channels to enhance separation is outlined using a closed-over channel structure fabrication approach. This structure is achieved using a non-conformal film deposition process over a high aspect ratio groove pattern in a rigid, smooth, and high temperature substrate. This is shown in FIGS. 10(a)-(c). FIGS. 10(d) through (g) illustrate the subsequent system fabrication and then separation in accordance with the earlier descriptions of invention. The non-conformal film deposition seen in FIGS. 10(b) and (c) can be easily achieved with a physical vapor deposition processes, such as evaporation and sputtering method. Also, relatively conformal deposition technologies, like chemical vapor deposition (CVD) or plasma enhanced chemical vapor deposition (PECVD), can be used by choosing appropriate process parameters (e.g. source gas temperature, source gas flow rate, substrate temperature, process pressure). For example, a higher process pressure can be used in a CVD process in order to increase probability of scattering (decrease of mean free path) of deposition species near the groove opening, which can result in more film deposition near the opening than bottom/side wall of the groove pattern. A similar result can be achieved by controlling other appropriate process parameters.

After the capping layer seals the opening of the groove pattern, further deposition of this layer or subsequent layers can be used to planarize the substrate surface. Chemical mechanical processing (CMP) may also be used for this planarization, if necessary, In FIG. 10(c), this planar capping layer deposition has been finished and this layer will be used as the sacrificial release layer upon completion of system fabrication.

In FIG. 10(d), a capping material is deposited over the sacrificial layer. This capping material will serve as a barrier layer isolating chemical processing steps. The material, thickness, and relevant properties of the barrier layer can be chosen in such a manner that it survives system fabrication processing as well as the separation process. This capping material can also be formed by changing the top part of the sacrificial layer (e.g. thermal oxidation).

Upon completion of the device fabrication, as shown in FIG. 10(f), a final building layer or layers (e.g., plastics, glasses) is deposited or coated. This will be the support and transportation medium carrying the system to some new final substrate after it is separated. It can also be the final substrate. In the release step, the channel network is exposed to appropriate chemicals, gases, any other removal agents, or their combination, which will selectively remove the sacrificial release layer. In the case when a chemical is used to dissolve or etch the release layer, the micro-fluidic structure will served as a fast supply mechanism of the chemical due to strong capillary effect. When reactive gases or plasmas are used for the removal agents, the micro-channel structure can also be served as a fast gas supply path for the reactions. In any case, the release time and any possible damage to the device parts can be minimized. FIG. 10(g) shows a separated system and the mother substrate, which can be reused.

The closed-over channel capping approach discussed here results in open channels for sacrificial layer removal. Alternatively one could establish the sacrificial layer in the channel network and all across the mother substrate. The channels in the mother substrate could be filled with sacrificial material by a lift-off approach and the sacrificial material deposition could then be continued to cover the whole mother substrate or a particle approach could be used. Approaches explicitly showing particle use in the channels only are seen in FIGS. 12, 13a and 13b. Here a sacrificial material removal agent clears the channels and their relatively large cross-section this then used to expedite removal agent arrival to the rest of the (particle or non-particle) sacrificial layer. In FIG. 13a the channel clearing step is shown to be early in the process flow just to demonstrate further process flow flexibility, if desired. In FIG. 13a the removal agent would gain access to the channels at lateral access ports (not shown) and subsequently to the whole-surface sacrificial layer. In FIG. 13b the removal agent would gain access to the channels by way of vertical vias in the mother substrate, as shown, and subsequently to the whole-surface sacrificial layer.

FIG. 12-A is a Mono- or multi-layers of nano- or micro-spheres being formed by a coating onto a substrate. The coating may involve self-assembly agents (molecules), steric assembly, or field assisted assembly. Planarization (FIG. 12-B) of the layer of nano- or micro-spheres may be accomplished by spin-on-glass (SOG), reflowable oxide, or any other appropriate materials and processes. FIG. 12-C depicts fabrication of a system on the planarized surface. FIG. 12-D depicts coating or deposition of carrier or final substrate layer after completion of the system fabrication. FIGS. 12-E and F depict formation of a through-hole structure down to the layer of nano- or micro-spheres on either (E or F) side of the structure, which will serve a conduit for removal agent access to remove the layer of the nano- or micro-spheres. FIG. 12-G shows that, after removal of the layer of nano- or micro-spheres, the system has been separated from the mother substrate.

FIGS. 13a-A and B show the channel structure formation using processes described above FIGS. 12a-A through D. FIG. 13a-C show system fabrication using appropriate processes on the channel structure. A transport layer such as plastic or polymer film can be deposited or coat over the fabricated systems. FIGS. 13a-D and E show that upon completion of system fabrication, the channel structure has been contacted with a chemical agent, which will flow through the channels by the capillary effect, for example, and attack a release layer between the channel structure and the device. This results in separation (release) of the system (top portion in this FIG.) part from the mother substrate.

FIG. 13b-A depicts formation of channel structure filled with micro- or nano-size beads using processes described FIGS. 12-A through C except for device fabrication. A device is fabricated on the structure in FIG. 13b-B. FIG. 13b-C shows the definition of access holes down to the bead-filled channel structure from the bottom or top of the structure. FIGS. 13b-D and E show the removal of the release layer and beads using the channel structure and through holes. This results in separation of the top portion (device part) from the mother substrate.

The claimed invention is:

1. A method for preparing a removable system on a mother substrate, comprising the steps of:
    depositing a high surface area to volume ratio sacrificial layer on a mother substrate;
    stabilizing the sacrificial layer by a) removing volatile chemical species in and on the sacrificial layer and/or b) modifying the surface of the layer;
    coating over the sacrificial layer with a capping medium;
    fabricating a system on the capping medium;
    providing through holes to access the sacrificial layer; and
    removing the sacrificial layer to release the system.

2. A method of claim 1, wherein said high surface area to volume ratio material is a column-void film or beads.

3. A method of claim 2, wherein said column-void film is selected from the group consisting of silicon, silicon oxide, germanium, germanium oxide, and a silicon alloy optionally containing hydrogen, chlorine, or fluorine.

4. A method of claim 1, wherein the stabilizing step comprises removing hydrogen from the sacrificial layer, modifying the surface of the sacrificial layer by partial oxidation, and/or nitridation; and
    wherein the coating step comprises applying a capping medium comprising stacked film structure of $SiO_2$ and $Si_3N_4$ over the sacrificial layer.

5. A method of claim 1, further comprising, after the fabricating step, a step of applying a top layer comprising at least one of polymer, glass, organic, plastic, semiconductor, quartz, oxide, nitride, insulator, conductor, metal and ceramic layer on the system.

6. A method of claim 5, wherein said through holes to access the sacrificial layer are provided through the top layer, system, capping layer and/or mother substrate.

7. A method of claim 1, wherein the mother substrate contains through holes to access the sacrificial layer.

8. A method of claim 7, wherein the through holes in the mother substrate constitute a network of through holes in the plane of the substrate or through the thickness of the substrate.

9. A method of claim 1, further comprising, after the fabricating step, the step of:
    conditioning the exposed surface of the system to enhance bonding of a top layer to the system surface.

10. A method of claim 1, further comprising, after the fabricating step, the steps of:
    applying onto the system a polymer layer to form a covered system;
    conditioning the exposed surface of the polymer top layer to enhance bonding; and
    applying a top layer comprising at least one of polymer, glass, organic, plastic, semiconductor, quartz, oxide, nitride, insulator, conductor, metal or ceramic to the conditioned polymer surface.

11. A method of claim 5 or 10 wherein said top layer is a permanent substrate of the system.

12. A method of claim 11, wherein the resulting system is flexible.

13. A method of claim 5 or 10, further comprising, during or after the fabricating step but prior to application of the top layer, and prior to providing any top through holes, the steps of:
    selectively removing a portion of the system and capping layers to form void regions defining an array of islands composed of device, structure, or system and capping layer regions, and
    optionally filling the island-defining void region with a sacrificial material.

14. A method of claim 13, after application of any top layer and after providing any top through holes, further comprising the step of removing the sacrificial material and the high surface to volume sacrificial layer to release the system from the mother substrate.

15. A method of claim 13, wherein the filling step comprises depositing a high surface area to volume material into the void regions.

16. A method of claim 1, 2, or 4 further comprising, during or after the fabricating step but the step of providing any through holes, the steps of:
    selectively removing a portion of the system and capping layers to form void regions defining an array of islands composed of device, structure, or system and capping layer regions, and
    filling the island-defining void region with a sacrificial material.

17. A method of claim 1, further comprising after the removal step, adhering the system to a permanent substrate.

18. A method of claim 17, wherein the permanent substrate is flexible.

19. A method of claim 18, further comprising the step of applying a layer to the capping material side of the released system to form a configuration wherein the system is substantially within a bending-stress reduced neutral plane.

20. A method of claim 17, wherein the adhering step applies at least two system to the permanent substrate in a tiled pattern.

21. A method for preparing a removable system, comprising the steps of:
    forming a high surface area to volume ratio sacrificial layer on a mother substrate;
    stabilizing the sacrificial layer;
    forming a capping medium on the sacrificial layer;
    fabricating a device on the capping medium;
    forming holes in the capping medium to access the sacrificial layer; and
    removing the sacrificial layer to release the system.

22. A method of claim 21, wherein the stabilizing step comprises removing volatile chemical species in and on the sacrificial layer.

23. A method of claim 21, wherein the stabilizing step comprises modifying the surface of the sacrificial layer by partial oxidation and/or nitridation processes.

24. A method of claim 21, wherein the high surface area to volume ratio sacrificial layer comprises at least one of columnar void film, nanospheres, beads, and molecules.

25. A method of claim 21, wherein the device is selected from the group consisting of a transistor, a diode, an electron device, a chemical device, a biological device, a bio-chemical device, a fluidic device, a MEM, a sensor, a fuel cell, an opto-electronic device, a photovoltaic cell, an optical structure, and a microelectronic devices, a display, a circuit board system and combinations thereof.

* * * * *

UNITED STATES PATENT AND TRADEMARK OFFICE
CERTIFICATE OF CORRECTION

PATENT NO. : 7,309,620 B2  Page 1 of 1
APPLICATION NO. : 10/340723
DATED : December 18, 2007
INVENTOR(S) : Stephen J. Fonash et al.

It is certified that error appears in the above-identified patent and that said Letters Patent is hereby corrected as shown below:

~~The United States Government has rights in this invention under DARPA Grant No. S33615-98-1-5164.~~

Col. 1 line 15-16

This invention was made with government support under Grant No. F33615-98-1-5164, awarded by DARPA/Air Force. The Government has certain rights in the invention.

Signed and Sealed this

Sixth Day of April, 2010

David J. Kappos
*Director of the United States Patent and Trademark Office*